United States Patent
Mattisson et al.

(10) Patent No.: US 9,312,818 B2
(45) Date of Patent: Apr. 12, 2016

(54) LOW-NOISE AMPLIFIER

(71) Applicant: Telefonaktiebolaget L M Ericsson (publ), Stockholm (SE)

(72) Inventors: Sven Mattisson, Bjarred (SE); Stefan Andersson, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/375,127

(22) PCT Filed: Jan. 25, 2013

(86) PCT No.: PCT/EP2013/051492
§ 371 (c)(1),
(2) Date: Jul. 28, 2014

(87) PCT Pub. No.: WO2013/113636
PCT Pub. Date: Aug. 8, 2013

(65) Prior Publication Data
US 2015/0002225 A1    Jan. 1, 2015

Related U.S. Application Data

(60) Provisional application No. 61/596,330, filed on Feb. 8, 2012.

(30) Foreign Application Priority Data

Feb. 1, 2012    (EP) .................................... 12153472

(51) Int. Cl.
*H03F 1/34* (2006.01)
*H03F 1/30* (2006.01)
(Continued)

(52) U.S. Cl.
CPC .................. *H03F 1/301* (2013.01); *H03F 1/26* (2013.01); *H03F 1/342* (2013.01); *H03F 1/565* (2013.01);
(Continued)

(58) Field of Classification Search
CPC ..................................... H03F 1/34; H03F 1/14
USPC .................................. 330/294, 300, 107, 109
See application file for complete search history.

(56) References Cited

U.S. PATENT DOCUMENTS

| 4,422,052 A | 12/1983 | Yorkanis et al. |
| 4,689,578 A | 8/1987 | Spychalski |

(Continued)

FOREIGN PATENT DOCUMENTS

| EP | 1 635 453 A1 | 3/2006 |
| WO | 02/15397 A2 | 2/2002 |

(Continued)

OTHER PUBLICATIONS

PCT International Search Report, mailed Oct. 31, 2013, in connection with International Application No. PCT/EP2013/051492, all pages.

(Continued)

*Primary Examiner* — Henry Choe
(74) *Attorney, Agent, or Firm* — Leffler Intellectual Property Law, PLLC

(57) ABSTRACT

A common source or common emitter LNA circuit for amplifying signals at an operating frequency f in a receiver circuit is disclosed. The LNA circuit comprises an input transistor arranged to, in operation, be biased to have a transconductance $g_m$ at the operating frequency f, and having a first terminal, which is a gate or base terminal, operatively connected to an input terminal of the LNA circuit. The LNA circuit further comprises a shunt-feedback capacitor operatively connected between the first terminal of the input transistor and a second terminal, which is a drain or collector terminal, of the input transistor. Furthermore, the LNA circuit comprises an output capacitor operatively connected between the second terminal of the input transistor and an output terminal of the LNA circuit. The output capacitor has a capacitance value $C_L < g_m/f$.

26 Claims, 5 Drawing Sheets

(51) Int. Cl.
*H03F 1/26* (2006.01)
*H03F 3/195* (2006.01)
*H03F 1/56* (2006.01)
*H03F 3/185* (2006.01)

(52) U.S. Cl.
CPC ............... *H03F 3/185* (2013.01); *H03F 3/195* (2013.01); *H03F 2200/129* (2013.01); *H03F 2200/294* (2013.01); *H03F 2200/384* (2013.01); *H03F 2200/75* (2013.01)

(56) References Cited

U.S. PATENT DOCUMENTS

| | | | |
|---|---|---|---|
| 5,015,968 A * | 5/1991 | Podell | H03F 1/226 330/277 |
| 5,589,881 A | 12/1996 | Dunham et al. | |
| 5,963,094 A | 10/1999 | Linder et al. | |
| 6,147,559 A * | 11/2000 | Fong | H03F 1/22 330/294 |
| 6,204,728 B1 * | 3/2001 | Hageraats | H03F 1/22 330/294 |
| 6,211,738 B1 | 4/2001 | Hecht | |
| 7,202,733 B1 | 4/2007 | Aram et al. | |
| 7,466,205 B1 | 12/2008 | Lin et al. | |
| 7,843,269 B2 | 11/2010 | Chen et al. | |
| 2005/0225397 A1 | 10/2005 | Bhatia et al. | |
| 2006/0035611 A1 | 2/2006 | Connell et al. | |
| 2006/0068741 A1 | 3/2006 | Kamath et al. | |
| 2008/0048785 A1 | 2/2008 | Mokhtar et al. | |
| 2008/0169877 A1 | 7/2008 | Banba | |
| 2008/0224779 A1 | 9/2008 | Lin | |
| 2008/0290944 A1 | 11/2008 | Sarpeshkar et al. | |
| 2009/0021295 A1 | 1/2009 | Fu et al. | |
| 2015/0035602 A1 | 2/2015 | Mattisson et al. | |

FOREIGN PATENT DOCUMENTS

| | | |
|---|---|---|
| WO | 2006/083200 A1 | 8/2006 |
| WO | 2007034231 | 3/2007 |

OTHER PUBLICATIONS

PCT Written Opinion, mailed Oct. 31, 2013, in connection with International Application No. PCT/EP2013/051492, all pages.

Adabi, Ehsan et al. "CMOS Low Noise Amplifier with capacitive feedback matching" Proceedings IEEE 2007 Custom Integrated Circuits Conference, pp. 643-646.

Li, Qiang et al. "An Inductorless Low-Noise Amplifier with Noise Cancellation for UWB Receiver Front-End" IEEE 2006, pp. 267-270.

Im, Donggu et al. "A Low Power Broadband Differential Low Noise Amplifier Employing Noise and IM3 Distortion Cancellation for Mobile Broadcast Receivers" IEEE Microwave & Wireless Components Letters, vol. 20, No. 10, Oct. 2010, pp. 566-568.

PCT International Search Report, mailed Jun. 26, 2013, in connection with International Application No. PCT/EP2013/051504, all pages.

Bruccoleri, F. et al. "Noise cancelling in wideband CMOS LNAs" 2002 IEEE Solid-State Circuits Conference Digest of Technical Papers, Feb. 3-7, 2002, Piscataway, NJ, USA, Feb. 7, 2002, pp. 330, 331 and 533, XP032066685, ISBN: 978-0-7803-7335-8.

Bruccoleri, F. et al. "Noise cancelling in wideband CMOS LNAs" 2002 IEEE Solid-State Circuits Conference Digest of Technical Papers (Cat. No. 02CH37315), vol. 1, Jan. 1, 2002, pp. 406-407, XP055036202, ISBN: 978-0-78-037335-8.

Bruccoleri, F. et al. "Wide-Band Cmos Low-Noise Amplifier Exploiting Thermal Noise Canceling" IEEE Journal of Solid-State Circuits, IEEE Service Center, Piscataway, NJ, USA, vol. 39, No. 2, Feb. 1, 2004, pp. 275-282, XP011106496, ISSN: 0018-9200.

Chen, Wei-Hung et al. "A Highly Linear Broadband CMOS LNA Employing Noise and Distortion Cancellation" IEEE Journal of Solid-State Circuits, IEEE Service Center, Piscataway, NJ, USA, vol. 43, No. 5, May 1, 2008, pp. 1164-1176, XP011208016, ISSN: 0018-9200.

Liao, Chih-Fan et al. "A broadband noise-canceling CMOS LNA for 3.1-10.6-GHz Uwb receiver" 2005 IEEE Custom Integrated Circuits Conference, IEEE, Piscataway, NE, USA, Sep. 18, 2005, pp. 160-163, XP010873768, ISBN: 978-0-7803-9023-2.

E. M. Cherry, \Feedback, Sensitivity, and Stability of Audio Power Amplifiers, Journal of the Audio Engineering Society, vol. 30, pp. 282-294, May 1982, 13 pages.

Non-Final Office Action issued Aug. 24, 2015 in connection with copending U.S. Appl. No. 14/375,131, all pages.

European Search Report, mailed Oct. 23, 2015, in connection with counterpart European Application No. 15171109.0, all pages.

* cited by examiner

LOW-NOISE AMPLIFIER

CROSS-REFERENCE TO RELATED APPLICATIONS

This application claims priority under 35 U.S.C. §119 to European Patent Application No. 12153472.1, filed Feb. 1, 2012, which is hereby incorporated herein by reference in its entirety. This application also claims the benefit of U.S. Provisional Application No. 61/596,330, filed Feb. 8, 2012, which is hereby incorporated herein by reference in its entirety.

TECHNICAL FIELD

The present invention relates to the field of low-noise amplifiers for receivers, such as radio receivers.

BACKGROUND

When designing a low-noise amplifier (LNA) it is important to consider its required input matching (e.g. to 50Ω), matching bandwidth, noise figure, linearity and power consumption. If the LNA has a well behaved input impedance the matching network will be easy to design and robust in production. If the resistive component of the LNA's input impedance is very far from the desired matching impedance (e.g. 50Ω) it is very difficult to match it properly without adding extra resistive losses, and, hence, noise. Also a wide-band matching network will be more complex than a more narrow-band one. To keep cost and size down it is important that an LNA can be matched to several input frequencies. This requires wide band LNA structures. Finally, it is normally desirable to have a very high LNA input compression point without sacrificing power consumption.

Two common methods are used for setting the resistive part of the LNA input impedance: resistive shunt or inductive series degeneration.

In the case of a resistive shunt degeneration LNA, illustrated in FIG. 1, the input resistance (Rin) is set by the voltage gain of the circuit and the resistance Rf. Assuming the load is dominated by RL, the transconductance is set by Q1, and the open-loop input impedance is high, then we get Rin≈Rf/(1+gm1·RL), where gm1 is the transconductance of Q1. A typical value for Rf is about 500Ω. The common base transistor Q2 isolates the load resistor from Q1 to increase the voltage gain, and the emitter follower Q3 isolates Rf from RL to minimize loading Such a combination of a common-emitter and a common-base stage is called a cascode, and is a common way to improve the gain and reverse isolation of a single common-emitter stage. Cascodes can be formed of any combination of MOS, BJT and MESFET transistors, including mixed types. A drawback with the resistive shunt degeneration LNA is the presence of the resistor Rf, which degrades the noise figure. One possible way to improve the noise figure is to increase the gain. However, doing so would normally degrade the linearity.

In MOS and MESFET circuits, inductive series degeneration, illustrated in FIG. 2 is more common than resistive shunt degeneration. With the common terminology, the input resistance will be Rin≈gm·Lf/Cgs, where gm and Cgs are the transconductance and the gate-to-source capacitance, respectively, of the transistor M1. A typical value of Lf is 1 nH. The inductive series degeneration is inherently more narrow band as the input impedance basically corresponds to an RLC series resonator, typically with at least a moderate Q (e.g. 1<<Q<10, which can typically be obtained for an on-chip inductor). A drawback with the series degeneration of FIG. 2 is that the LNA closed-loop transconductance is reduced, typically to half the value of M1 alone, and that it is requiring a matching inductor Lg, which typically is external as its value depends on the actual operating frequency. The size of Lf, when integrated on chip, may also be an issue. Furthermore, the structure is inherently narrow band as the input impedance approximately corresponds to a series resonator.

The article Adabi et al, "CMOS Low Noise Amplifier with capacitive feedback matching", Proc. IEEE 2007 Custom Integrated Circuits Conference, pp. 643-646 (in the following referred to as "Adabi et al") shows in FIG. 1 therein an LNA with a capacitive feedback.

SUMMARY

The inventors have realized that the use of a capacitive feedback LNA such as that illustrated in FIG. 1 of Adabi et al can alleviate at least some of the drawbacks of the resistive shunt degeneration LNA and the inductive series degeneration LNA described above. However, the inventors have further realized that, even if such a capacitive feedback LNA provides a matched resistive input-impedance with relative wide bandwidth, the useable bandwidth of the LNA is nevertheless limited because the bandwidth of the gain is relatively low in comparison with the bandwidth of the resistive input impedance. An object of the present invention is therefore to provide an improved low-noise amplifier with capacitive feedback for use in a receiver circuit.

According to a first aspect, there is provided a common source or common emitter low-noise amplifier (LNA) circuit for amplifying signals at an operating frequency f in a receiver circuit. The LNA circuit comprises an input transistor arranged to, in operation, be biased to have a transconductance $g_m$ at the operating frequency f, and having a first terminal, which is a gate or base terminal, operatively connected to an input terminal of the LNA circuit. The LNA circuit further comprises a shunt-feedback capacitor operatively connected between the first terminal of the input transistor and a second terminal, which is a drain or collector terminal, of the input transistor. Moreover, the LNA circuit comprises an output capacitor operatively connected between the second terminal of the input transistor and an output terminal of the LNA circuit. The output capacitor has a capacitance value $C_L < g_m / f$.

The input transistor may be a MOS transistor, whereby the first terminal is a gate terminal, the second terminal is a drain terminal, and the LNA circuit is a common source LNA circuit. The shunt-feedback capacitor may be or comprise a MOS gate capacitor implemented with a MOS transistor of the same type as the input transistor. The feedback capacitor may be or comprise a gate-to-drain capacitance of the input transistor.

The input transistor may be a bipolar junction transistor, whereby the first terminal is a base terminal, the second terminal is a collector terminal, and the LNA circuit is a common emitter LNA circuit.

The LNA circuit may comprise a series inductor operatively connected between the first terminal of the input transistor and the input terminal of the LNA circuit 30.

According to a second aspect, there is provided a receiver circuit. The receiver circuit comprises the LNA circuit according to the first aspect. The receiver circuit further comprises a termination circuit with a current input terminal connected to the output terminal of the LNA circuit.

The magnitude $|Z_{in}(f)|$ of the input impedance $Z_{in}$ of the termination circuit at the frequency f may be less than ⅒ of the magnitude $|Z_{C_L}|=1/(2\pi f \cdot C_L)$ of the impedance $Z_{C_L}(f)$ of the output capacitor of the LNA circuit.

The termination circuit may be or comprise a common-base amplifier, a common-gate amplifier, a trans-impedance amplifier, a feedback-connected operational amplifier with a virtual-ground node as current input terminal, a transformer, or a current-mode mixer.

The receiver circuit may be a radio receiver circuit.

According to a third aspect, there is provided a radio communication apparatus comprising the receiver circuit according to the second aspect. The radio communication apparatus may e.g. be, but is not limited to, a mobile terminal, a wireless data modem, or a radio base station.

According to a fourth aspect, there is provided a wireline communication apparatus comprising the receiver circuit according to the second aspect. The wireline communication apparatus may e.g. be, but is not limited to, a cable modem.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 3:
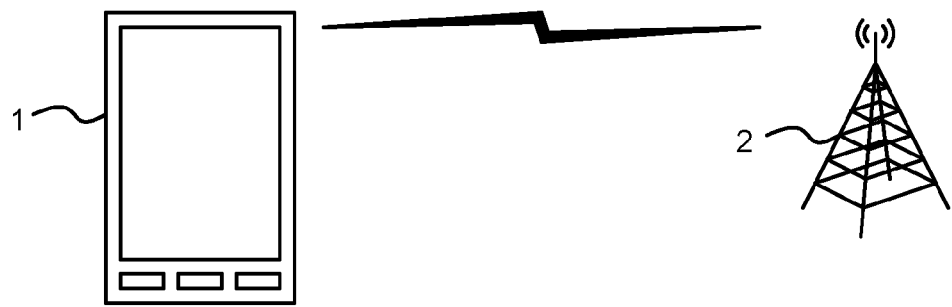
FIG. 3 schematically illustrates a mobile terminal in communication with a radio base station.

FIG. 3 illustrates schematically an environment in which embodiments of the present invention may be employed. In FIG. 3, a mobile terminal 1, illustrated in FIG. 3 as a mobile, or cellular, telephone 1, is in wireless communication with a radio base station 2, e.g. in a cellular communication network. The mobile telephone 1 and the radio base station 2 are nonlimiting examples of what is referred to below generically with the term radio communication apparatus. Another non-limiting example of such a radio communication apparatus is a wireless data modem, e.g. a wireless data modem to be used in a cellular communication network. Embodiments of the present invention may also be employed in radio communication apparatuses for operation in other types of communication networks, such as but not limited to wireless local area networks (WLANs) and personal area networks (PANs). Embodiments of the present invention may further also be employed in other types of communication apparatuses, e.g. wireline communication apparatuses, such as but not limited to cable modems.

Figure 4:
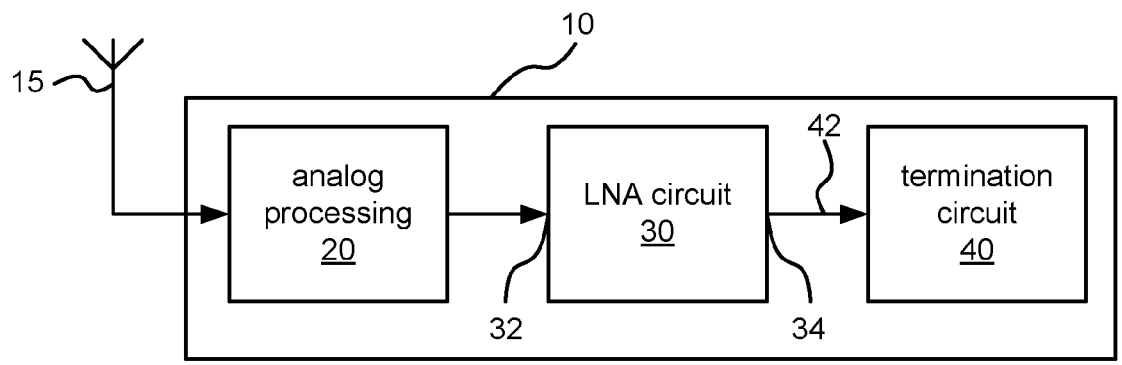
FIG. 4 shows a simplified block diagram of a radio receiver circuit according to some embodiments of the present invention.

Communication apparatuses may comprise one or more receiver circuits, such as a one or more radio receiver circuits in the case of radio communication apparatuses. An example of such a radio receiver circuit is briefly described below with reference to FIG. 4. FIG. 4 is a simplified block diagram of a radio receiver circuit 10 according to an embodiment of the present invention. In FIG. 4, the radio receiver circuit 10 is connected to an antenna 15 for receiving electromagnetic radio frequency (RF) signals. Although a single antenna 15 is shown in FIG. 4, multiple antennas may well be used in other embodiments. In the embodiment illustrated in FIG. 4, the radio receiver circuit comprises analog processing circuitry 20 for operative connection to the antenna 15. The analog processing circuitry 20 is adapted to perform (analog) signal processing on RF signals from the antenna 15. The analog processing circuitry 20 may comprise one or more filters and/or other circuitry for processing of RF signals. Such circuitry is, per se, well known in the art of radio receivers and is therefore not further described herein in greater detail.

Furthermore, the embodiment of the radio receiver circuit 10 illustrated in FIG. 4 comprises a low-noise amplifier (LNA) circuit 30, having an input terminal 32 and an output terminal 34. Embodiments of the LNA circuit 30 are described in further detail below. The embodiment of the radio receiver circuit illustrated in FIG. 4 further comprises a termination circuit 40 having an input terminal 42 connected to the output terminal 34 of the LNA circuit 30. The term "termination circuit" in this context refers to any circuit that is connected to the output terminal 34 of the LNA circuit 30, and thus acts as a termination for the LNA circuit 30.

As indicated above, embodiments of the LNA circuit 30 may be employed in other types of receiver circuits than radio receiver circuits, e.g. receiver circuits for wireline communication apparatuses. In that case, instead of the antenna, such a receiver circuit may be connected to a connector for connection with a wireline communication network. The basic structure indicated in FIG. 4, with analog processing circuitry 20, an LNA circuit 30, and a termination circuit 40 may be used in such a (non-radio) receiver circuit as well.

Figure 1:
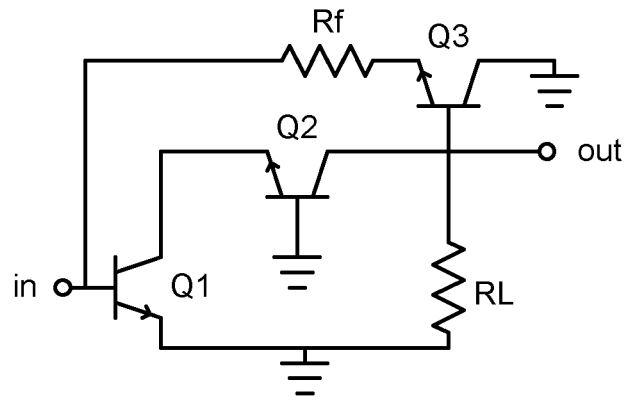
FIG. 1 illustrates a resistive shunt feedback low-noise amplifier.
Figure 2:
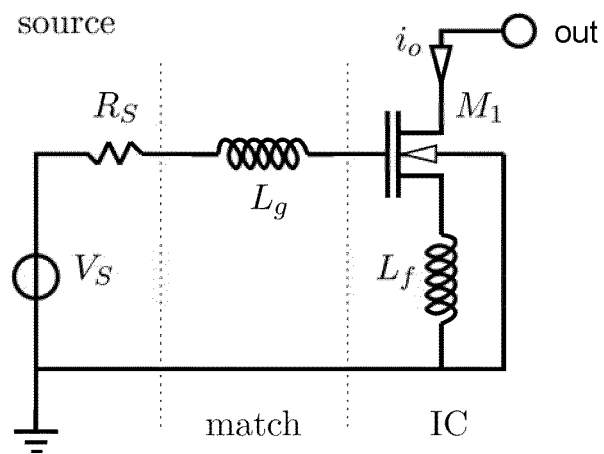
FIG. 2 illustrates an inductive series degenerated low-noise amplifier.

Before describing embodiments of the LNA circuit 30 in more detail, a description of the inventors' further analysis of the circuits in FIGS. 1 and 2 is provided to facilitate the understanding of the embodiments of the present invention. In the following, w denotes angular frequency and $s=j\omega$, where j is the imaginary unit.

A drawback with the resistive shunt feedback circuit (FIG. 1) is that it requires relatively high current levels through Q3 for proper operation and that Q3 adds parasitic (outside the feedback loop, Rf) loading of the output node which limits the high-frequency performance. The feedback resistor also adds capacitive losses to the substrate (ground) which influences the high-frequency performance. If Q3 is not used (i.e. Rf connects to RL directly) the gain will be slightly lower as some of the Q1 collector current will flow through Rf. Unless Rf>>Rin (e.g., when the voltage gain is very high), Rf will degrade the noise figure (NF) significantly. The collector noise of Q1, or drain noise in the MOS case, $i_n^2$, will also be fed back to the input and add noise. As a rough approximation we can say that the noise degradation (increase) due to Rf and $i_n^2$ $$\Delta NF \approx 10\log_{10}\left(1 + \frac{\gamma}{g_{m1}R_{in}}\left(\frac{A}{2+A}\right)^2 + \frac{1}{1+A}\right) \quad \text{Eq. 1}$$

In Eq. 1, A denotes the voltage gain of the circuit, γ is approximately ½ for a bipolar junction transistor (BJT) and approximately ⅔ for a MOS transistor, and $R_{in}$ and $g_{m1}$ are the input resistance of the circuit and the transconductance of transistor Q1, respectively. For a BJT running at 5 mA at $R_{in}$=50Ω and A=10, the noise-figure degradation ΔNF is about 0.65 dB. The corresponding noise-figure degradation ΔNF for a MOS transistor implementation at the same current is about 0.9 dB, and obtaining a similar ΔNF as in the BJT case would require about twice the current in the MOS transistor implementation.

A high LNA voltage gain is required for low noise but will at the same time reduce linearity as clipping of the output node is at a fixed level, limited by the bias current or supply voltage, and the corresponding input compression point will, thus, be inversely proportional to the LNA gain. For example, assuming clipping at the LNA output occurs at 1V amplitude, then with A=10 we get an input compression point in 50Ω at around −10 dBm. One volt amplitude corresponds almost to a rail-to-rail swing for a typical bipolar transistor, while it is almost twice the supply voltage of MOS devices. Thus, this is already higher than what is practical and cannot easily be increased; the gain has to be limited for reasonable linearity. That is, there is a built-in conflict between linearity and noise figure for the resistive shunt feedback LNA. Shunt peaking by inserting an inductor in series with RL or using a parallel resonator instead of RL will not fundamentally change this problem, only provide slightly higher bandwidth, or operating frequency, respectively, at a lower power consumption but at a relatively high area and cost penalty.

A drawback with the series degeneration of FIG. 2 is that the LNA closed-loop transconductance is reduced, typically to half the value of the transconductance of $M_1$ alone. Furthermore, a matching inductor $L_g$ is required. This is typically an external (or "off-chip") inductor as its value depends on the actual operating frequency. The size of $L_f$, when integrated on chip, may also be an issue. Furthermore, the structure inherently has a relatively narrow bandwidth as the input impedance is approximately $$Z_{in}(s) = Z_{match}(s) + Z_{IC}(s) \approx sL_g + \frac{1}{sC_{gs}} + (1+\beta(s))sL_f = \frac{1}{sC_{gs}} + s(L_f + L_g) + g_m \frac{L_f}{C_{gs}} \quad \text{Eq. 2}$$

This corresponds to a series resonator. The parameter β(s) is the frequency dependent current gain of the transistor $M_1$, $g_m$ denotes the transconductance of the transistor $M_1$, $C_{gs}$ denotes the gate-to-source capacitance of the transistor $M_1$, and $Z_{match}(s)$ and $Z_{IC}(s)$ denote the impedance of the part labeled match and the part labeled IC (Integrated Circuit), respectively, in FIG. 2. This series resonator needs to be tuned for each frequency band of interest, and although the integrated parts, $M_1$ and $L_f$, may support a wider frequency range, the inductor $L_g$ has to be optimized for each band configuration. Sometimes $L_g$ is replaced by a more complex matching network to compensate for parasitics (not shown in FIG. 2), e.g. ESD (Electro-Static Discharge) protection, but this does not significantly increase the frequency range for a given set of component values.

Figure 5:
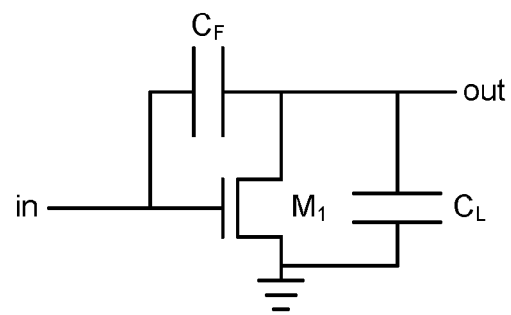
FIG. 5 illustrates a conventional capacitive shunt feedback amplifier.

The inductive series feedback relies on a frequency dependent current gain ($A_I$) of the input transistor to obtain a resistive impedance match. This is true for most MOSFETs as $A_I \approx g_m/(sC_{gs})$, and thus has a capacitive behavior, for all frequencies of interest. A similar resistive impedance matching, without the need for a coil $L_f$ can be obtained with a capacitive shunt feedback LNA (such as that shown in FIG. 1 of Adabi et al). A simplified schematic circuit diagram of such a capacitive shunt feedback LNA is illustrated in FIG. 5 for reference. This circuit converts the capacitive feedback impedance to a resistive input impedance by means of a frequency dependent (∝1/ω) voltage gain.

The input impedance of the circuit in FIG. 5 is approximately $$Z_{in}(s) \approx \frac{\frac{1}{g_m}\left(1 + \frac{C_L}{C_F}\right)}{1 + s\frac{C_{gs}}{g_m}\left(1 + \frac{C_L}{C_F}\right)} \quad \text{Eq. 3}$$

The input impedance has a low-pass characteristic with a resistive part approximately equal to $(1+C_L/C_F)/g_m$ and a bandwidth approximately equal to $\omega_T/(1+C_L/C_F)$, where $\omega_T$ denotes the angular transit frequency of the transistor which typically is much larger than the operating frequency.

The voltage gain $A_v$ of the circuit in FIG. 5 is frequency dependent with a low-pass character $$A_v \approx \frac{sC_F - g_m}{sC_F + sC_L} \approx -\frac{g_m}{sC_F + sC_L} \quad \text{Eq. 4}$$

The approximations in Eq. 4 are valid for typical component values and typical frequencies of interest achievable and used in integrated circuit LNAs. So, in spite giving a wideband resistive input impedance the gain is not, which limits the usable frequency range. In accordance with embodiments of the present invention, this limitation is alleviated by means the concept of using the current through $C_L$ as the output rather than the voltage across it. This can be accomplished by terminating the ground end of $C_L$ in a low impedance node, such that the current through $C_L$ is essentially independent of this termination, yielding a transconductance $$G \approx A_v sC_L \approx \frac{sC_F - g_m}{sC_F + sC_L} sC_L \approx -\frac{g_m C_L}{C_F + C_L} \quad \text{Eq. 5}$$

This is an approximately frequency independent transconductance when $\omega \ll g_m/C_F$.

Simplified schematic circuit diagrams of the LNA circuit 30 according to embodiments of the present invention, arranged to operate according to the above-mentioned concept, are provided in FIGS. 6-9. In embodiments of the present invention, the LNA circuit 30 is capable of amplifying signals at an operating frequency f (corresponding to an angular frequency ω=2πf), or a continuous band of such operating frequencies. In some embodiments, the operating frequency f (or continuous band) is a fixed predetermined frequency (or continuous band). In other embodiments, the LNA circuit is tunable to several such operating frequencies f (or continuous bands). In embodiments of the present invention, the LNA circuit 30 comprises an input transistor 50 having a first terminal 52, a second terminal 54, and a third terminal 56. The input transistor 50 may be a MOS transistor or a BJT. In case of a MOS transistor, the first terminal 52 is a gate terminal, the second terminal 54 is a drain terminal, and the third terminal 56 is a source terminal. In case of a BJT, the first terminal 52 is a base terminal, the second terminal 54 is a collector terminal, and the third terminal 56 is an emitter terminal. The input transistor 50 is arranged to, in operation, be biased to have a transconductance $g_m$ at the operating frequency f. Furthermore, in embodiments of the present invention, the LNA circuit comprises a shunt-feedback capacitor 60 operatively connected between the first terminal 52 of the input transistor 50 and the second terminal 54 of the input transistor 50. Moreover, in embodiments of the present invention, the LNA circuit comprises an output capacitor 65 operatively connected between the second terminal 54 of the input transistor 50 and the output terminal 34 of the LNA circuit 30. Using a consistent notation with FIG. 5, the capacitance of the shunt-feedback capacitor 60 is in the following denoted $C_F$, and the capacitance of the output capacitor 65 is in the following denoted $C_L$. Although the shunt-feedback capacitor 60 is shown in the figures as an individual component, separate from the input transistor 50, it should be noted that the parasitic gate-to-drain capacitance of the input transistor 50 may provide a non-negligible contribution to the capacitance $C_F$. Thus, the shunt-feedback capacitor 60 may in many cases be seen as comprising the gate-to-drain capacitance of the input transistor 50 as well as a dedicated capacitor in parallel therewith. In extreme cases, the shunt-feedback capacitor 60 may even be built up by (or, simply phrased, "be") the gate-to-drain capacitance of the input transistor 50 alone.

Figure 6:
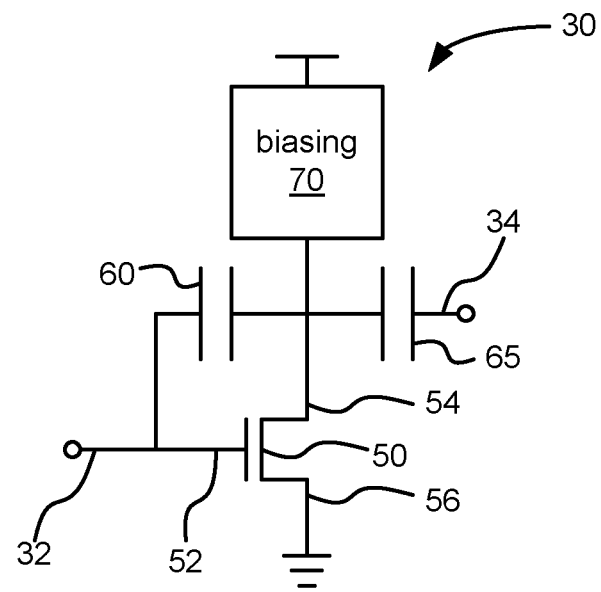
FIGS. 6-9 are simplified schematic circuit diagrams of embodiments of a low-noise amplifier circuit.
Figure 7:
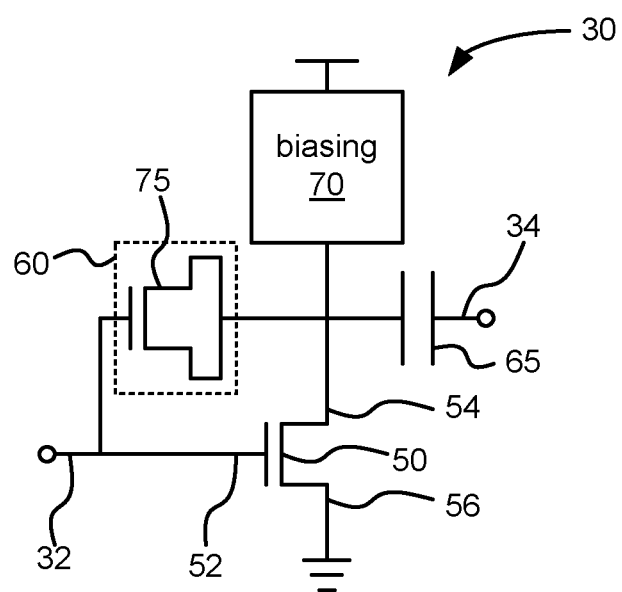

FIG. 6 illustrates an embodiment of the LNA circuit 30 wherein the input transistor 50 is a MOS transistor, and the LNA circuit 30 is a common source LNA circuit. In FIG. 6, a biasing unit 70 adapted to bias the LNA circuit 30 at a suitable operating point is included. The biasing unit 70 may be comprised in the LNA circuit 30, or may be external to the LNA circuit 30. Alternatively, part of the biasing circuit 70 may be comprised in the LNA circuit 30 while the remainder of the biasing circuit 70 may be external to the LNA circuit 30. The biasing unit 70 may e.g. comprise a passive network and/or an active network arranged to provide a suitable DC biasing current for the input transistor 50. Typically, the biasing unit 70 would be designed such as to provide an open circuit at the operating frequency f (or the continuous band of such operating frequencies). The biasing unit 70 is included also in the embodiments illustrated in FIGS. 7-9. The design of a suitable biasing unit 70 for a particular embodiment would be a straightforward task for a person skilled in amplifier design and is therefore not further described herein in any greater detail.

For noise reasons, the transconducatance $g_m$ should typically be made larger, normally much larger, than $1/R_S$ (the reciprocal of the source resistance, as seen by the LNA, which is also the matching resistance). Thus, the shunt-feedback capacitance $C_F$ can be made relatively small (i.e. with small capacitance, which also translates to a small area) and typically smaller, normally much smaller, than the capacitance $C_L$ of the output capacitor 65. Furthermore, the loop feedback factor, or return ratio, can be made relatively small. This implies that the gain reduction due to $C_F$ is typically relatively small.

As hinted above, depending on chosen design parameters of the input transistor 50 and the capacitance $C_L$ of the output capacitor 65, the aforementioned gate-to-drain capacitance (or "internal shunt feedback capacitance") of the input transistor 50 may provide a significant contribution to $C_F$. Consequently, a relatively small additional area may be needed for the shunt-feedback capacitor 60 in order to reach the value of $C_F$ that is needed to reach the desired input resistance.

In an integrated environment, the transistors and capacitors may be made in the same technology and $g_m$, $C_F$, and $C_L$ are correlated resulting in tight tolerances. If the shunt-feedback capacitor 60 (or the part of the shunt feed-back capacitor 60 that is not the gate-to-drain capacitance of the input transistor 50) is built from an MOS gate capacitor, the matching condition will only depend on a capacitance ratio (i.e. layout feature sizes) and the transconductance $g_m$ of the input transistor 50. In practice this reduces the design work to control $g_m$ of the input transistor 50 and to make sure that parasitics are included reasonably well in the modeling of $C_F$ and $C_L$, and thus provides a relatively low design complexity, which is advantageous. Accordingly, in some embodiments of the present invention, wherein the input transistor 50 is a MOS transistor the shunt-feedback capacitor 60 is, or comprises, a MOS gate capacitor implemented with a MOS transistor of the same type as the input transistor 50. This is illustrated with an example in FIG. 7, where the shunt-feedback capacitor of the embodiment in FIG. 6 has been implemented with a MOS transistor 75.

Figure 8:
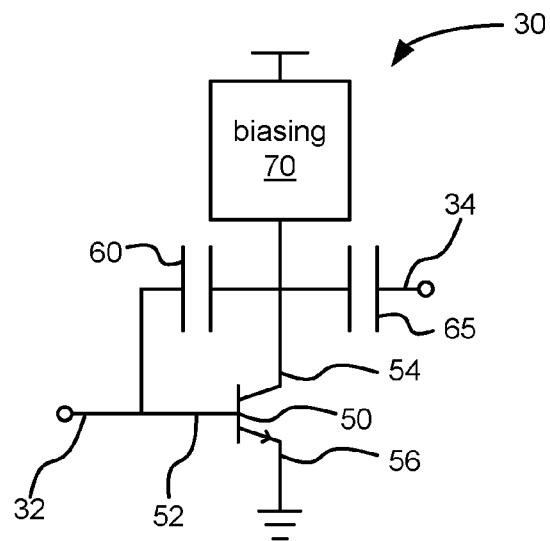
Figure 9:
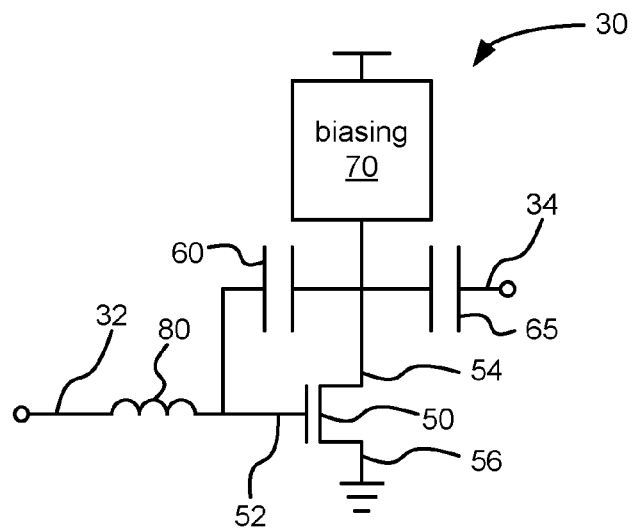

As mentioned above, other types of transistors than MOS transistors may be used for the input transistor 50 of the main amplifier. This is illustrated in FIG. 8, which shows an embodiment of the LNA circuit 30 wherein the input transistor 50 is a bipolar junction transistor (BJT) in common-emitter configuration If needed, a relatively small series inductor can be used to broaden the bandwidth by making the low-pass characteristic of the input impedance a second order, instead of a first order low-pass characteristic, which is the case without such an inductor (see e.g. Eq. 3). Such an inductor would still make the structure low-pass, and hence not operating frequency dependent, and can thus, be integrated or be part of the package or PCB. Therefore, according to some embodiments, the LNA circuit 30 comprises a series inductor operatively connected between the first terminal 56 (i.e. gate or base) of the input transistor 50 and the input terminal 32 of the LNA circuit 30. This is illustrated in FIG. 9 with an example embodiment where a series inductor 80 has been added (connected between the first terminal 52 of the input transistor 50 and the input terminal 32 of the LNA circuit 30) to the embodiment illustrated in FIG. 6.

In embodiments of the present invention, the output capacitor 65 is made relatively small. This is in contrast with so called DC blocking capacitors, for which the capacitance is normally selected relatively large to effectively block the DC-level from propagating and provide essentially a short circuit at the frequency of interest. More specifically, according embodiments of the present invention, the output capacitor 65 has a capacitance value $C_L < g_m/f$, which is significantly lower than what would be used for a DC-blocking capacitor. With this choice of capacitor value there will be some residual signal voltage across the capacitor which acts like a frequency dependent voltage-to-current converter. This converter action in combination with the frequency dependent voltage gain at the node 54 provides a frequency independent gain (i.e. transconductance) from LNA input to load capacitor current. When this gain is frequency independent a wideband operation is facilitated.

As mentioned above in the context of FIG. 4, the LNA circuit 30 may be comprised in a radio receiver circuit 10, together with a termination circuit 40. According to some embodiments of the present invention, the input terminal 42 of the termination circuit 40, which is connected to the output terminal 34 of the LNA circuit 30, is a current input terminal, i.e. a terminal that is specifically designed (or "particularly well suited") to receive an electrical current as input. This property may e.g. be defined, or quantified, in terms of input impedance or scattering parameters. For example, according to some embodiments, the magnitude $|Z_{in}(f)|$ of the input impedance $Z_{in}$ of the termination circuit 40 at the frequency f is less than 1/10 of the magnitude $|Z_{C_L}(f)|=1/(2\pi f \cdot C_L)$ of the impedance $Z_{C_L}(f)$ of the output capacitor 65 of the LNA circuit 30. (Note that $Z_{in}$ in the preceding sentence is used to denote the input impedance of the termination circuit 40, whereas in Eq. 2-3, it is used to denote the input impedance of the LNA circuit. Having emphasized that, there should be no risk for confusion.) The ratio 1/10 is only an example; other numbers may be used as well depending on application. A suitable ratio for a given application, with given performance requirements on the LNA circuit 30, may e.g. be determined using computer simulations. The ratio 1/10 may be a suitable starting point for such simulations.

The input impedance of the termination circuit 40 in turn affects the s11 scattering parameter of the LNA circuit 30, which thus in turn can be used to characterize the suitability of the termination circuit for receiving an electrical current as an input signal. For example, input terminal 32 of the LNA circuit 30 is less than −10 dB at the frequency f. The s11 parameter value −10 dB is only an example; other numbers may be used as well depending on application. A suitable s11 parameter value for a given application, with given performance requirements on the LNA circuit 30, may e.g. be determined using computer simulations. The s11 parameter value −10 dB may be a suitable starting point for such simulations.

Figure 10:
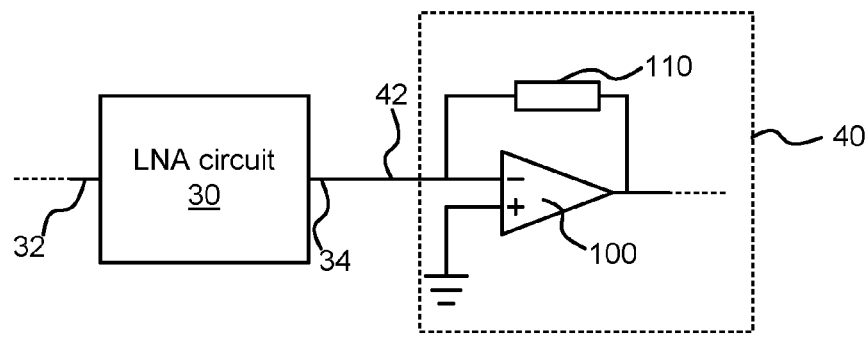
FIGS. 10-11 illustrates part of a radio receiver circuit according to an embodiment of the present invention.
Figure 11:
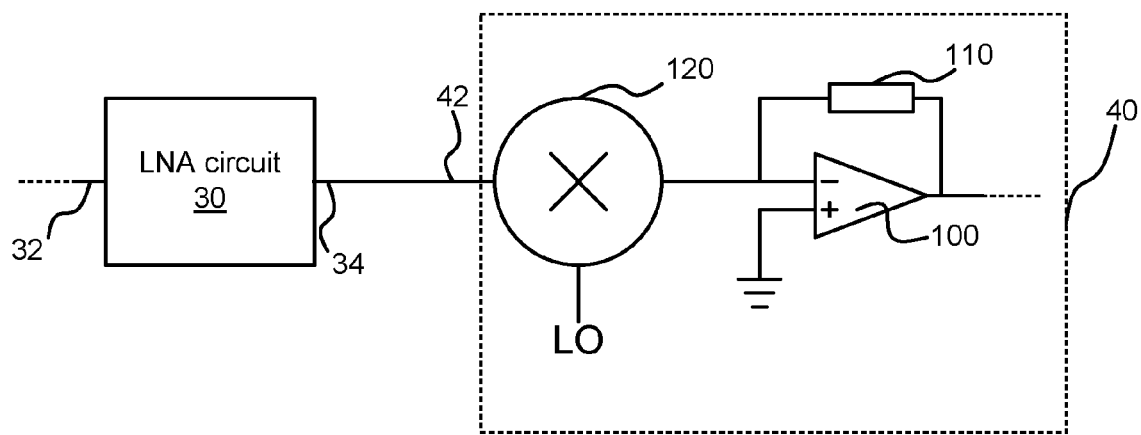

FIG. 10 illustrates with an example how a termination circuit 40 with such a current input terminal may be accomplished. In FIG. 10, the termination circuit 40 comprises a feedback-connected operational amplifier 100. In FIG. 10, the negative feedback of the operational amplifier 100 provides a virtual ground node at the negative input terminal of the operational amplifier 100. Qualitatively speaking, varying the current input to the input terminal 42 would only result in a relatively small voltage variation (ideally none for an operational amplifier with infinite gain) at the input terminal 42, whereby the input terminal 42 is suitable for receiving an input current. In FIG. 10, the virtual-ground node of the feed-back connected operational amplifier 100 is used as current input terminal. The example illustrated in FIG. 10 is only an example. Another example of a circuits that can be designed to have a suitable input impedance value, or provide a suitable s11 value for the LNA circuit 30, to be suitable for receiving an electrical current as input signal is a current-mode mixers. This is illustrated in FIG. 11, showing a mixer 120, driven by a local oscillator signal "LO", connected in the path between the LNA circuit and feedback-connected operational amplifier 100. Other examples of circuits that can be designed to have a suitable input impedance value, or provide a suitable s11 value for the LNA circuit 30, to be suitable for receiving an electrical current as input signal are e.g. common-base amplifiers, common-gate amplifiers, trans-impedance amplifiers, and transformers. Thus according to some embodiments of the present invention, the termination circuit 40 is or comprises a common-base amplifier, a common-gate amplifier, a trans-impedance amplifier, a feedback-connected operational amplifier 100 with a virtual-ground node as current input terminal, a transformer, or a current-mode mixer.

The present invention has been described above with reference to specific embodiments. However, other embodiments than the above described are possible within the scope of the invention. The different features of the embodiments may be combined in other combinations than those described. For example, even though the series inductor 80 (FIG. 9) and MOS gate capacitor 75 (FIG. 7) have been shown together with a MOS transistor as the input transistor 50, they may well be used together with a BJT as input transistor 50 as well. Furthermore, even though the series inductor 80 (FIG. 9) and MOS gate capacitor 75 (FIG. 7) have been shown in separate embodiments, they may of course be used together in other embodiments. Moreover, for simplicity of illustration, the LNA circuit 30 have been illustrated in FIGS. 6-9 with single-ended embodiments. However, these embodiments can be extended to differential embodiments in a straightforward manner for a person skilled in LNA design, for example by combining two single-ended LNA circuits 30. The use of single-ended embodiments for illustration in this detailed description is thus not intended as limiting for the scope, and it should be noted in this context that a differential amplifier can be considered as comprising a single-ended amplifier as a sub component. Furthermore, in the figures, shunt-feedback capacitor 60 and output capacitor 65 have been shown as directly connected to the second terminal of the input transistor 50. However, in some embodiments, there may well be some intervening or isolating components connected in between second terminal of the input transistor and either or both of the shunt-feedback capacitor 60 and the output capacitor, such as one or more cascode transistors, buffer transistors, and/or buffer amplifiers. The scope of the invention is only limited by the appended patent claims.

The invention claimed is:

1. A receiver circuit comprising:
a common source or common emitter low-noise amplifier (LNA) circuit for amplifying signals at an operating frequency f; and
a termination circuit with a current input terminal connected to the output terminal of the LNA circuit,
wherein the LNA circuit comprises:
an input transistor arranged to, in operation, be biased to have a transconductance $g_m$ at the operating frequency f, and having a first terminal, which is a gate or base terminal, operatively connected to an input terminal of the LNA circuit;
a shunt-feedback capacitor operatively connected between the first terminal of the input transistor and a second terminal, which is a drain or collector terminal, of the input transistor; and
an output capacitor operatively connected between the second terminal of the input transistor and an output terminal of the LNA circuit,
wherein the magnitude $|Z_{in}(f)|$ of the input impedance $Z_{in}$ of the termination circuit at the frequency f is less than 1/10 of the magnitude $|Z_{C_L}(f)|=1/(2\pi \cdot C_L)$ of the impedance $Z_{C_L}(f)$ of the output capacitor of the LNA circuit, wherein $C_L$ is a capacitance value of the output capacitor.

2. The receiver circuit according to claim 1, wherein the input transistor is a MOS transistor, the first terminal is a gate terminal, the second terminal is a drain terminal, and the LNA circuit is a common source LNA circuit.

3. The receiver circuit according to claim 2, wherein the shunt-feedback capacitor is or comprises a MOS gate capacitor implemented with a MOS transistor of the same type as the input transistor.

4. The receiver circuit according to claim 2, wherein the feedback capacitor is or comprises a gate-to-drain capacitance of the input transistor.

5. The receiver circuit according to claim 1, wherein the input transistor is a bipolar junction transistor, the first terminal is a base terminal, the second terminal is a collector terminal, and the LNA circuit is a common emitter LNA circuit.

6. The receiver circuit according to claim 1, further comprising a series inductor operatively connected between the first terminal of the input transistor and the input terminal of the LNA circuit.

7. The receiver circuit according to claim 1, wherein the receiver circuit is a radio receiver circuit.

8. A radio communication apparatus comprising the receiver circuit according to claim 7.

9. The radio communication apparatus according to claim 8, wherein the radio communication apparatus is a mobile terminal or a wireless data modem.

10. The radio communication apparatus according to claim 8, wherein the radio communication apparatus is a radio base station.

11. A wireline communication apparatus comprising the receiver circuit according to claim 1.

12. The wireline communication apparatus according to claim 11, wherein the wireline communication apparatus is a cable modem.

13. The receiver circuit of claim 1, wherein the capacitance value $C_L$ of the output capacitor satisfies $C_L < g_m/f$.

14. A receiver circuit comprising:
- a common source or common emitter low-noise amplifier (LNA) circuit for amplifying signals at an operating frequency f; and
- a termination circuit with a current input terminal connected to the output terminal of the LNA circuit,
- wherein the LNA circuit comprises:
  - an input transistor arranged to, in operation, be biased to have a transconductance $g_m$ at the operating frequency f, and having a first terminal, which is a gate or base terminal, operatively connected to an input terminal of the LNA circuit;
  - a shunt-feedback capacitor operatively connected between the first terminal of the input transistor and a second terminal, which is a drain or collector terminal, of the input transistor; and
  - an output capacitor operatively connected between the second terminal of the input transistor and an output terminal of the LNA circuit,
- wherein the termination circuit is or comprises a common-base amplifier, a common-gate amplifier, a trans-impedance amplifier, a feedback-connected operational amplifier with a virtual-ground node as current input terminal, a transformer, or a current-mode mixer.

15. The receiver circuit of claim 14, wherein the output capacitor has a capacitance value $C_L < g_m/f$.

16. The receiver circuit according to claim 14, wherein the input transistor is a MOS transistor, the first terminal is a gate terminal, the second terminal is a drain terminal, and the LNA circuit is a common source LNA circuit.

17. The receiver circuit according to claim 16, wherein the shunt-feedback capacitor is or comprises a MOS gate capacitor implemented with a MOS transistor of the same type as the input transistor.

18. The receiver circuit according to claim 16, wherein the feedback capacitor is or comprises a gate-to-drain capacitance of the input transistor.

19. The receiver circuit according to claim 14, wherein the input transistor is a bipolar junction transistor, the first terminal is a base terminal, the second terminal is a collector terminal, and the LNA circuit is a common emitter LNA circuit.

20. The receiver circuit according to claim 14, further comprising a series inductor operatively connected between the first terminal of the input transistor and the input terminal of the LNA circuit.

21. The receiver circuit according to claim 14, wherein the receiver circuit is a radio receiver circuit.

22. A radio communication apparatus comprising the receiver circuit according to claim 21.

23. The radio communication apparatus according to claim 22, wherein the radio communication apparatus is a mobile terminal or a wireless data modem.

24. The radio communication apparatus according to claim 22, wherein the radio communication apparatus is a radio base station.

25. A wireline communication apparatus comprising the receiver circuit according to claim 14.

26. The wireline communication apparatus according to claim 25, wherein the wireline communication apparatus is a cable modem.

* * * * *